United States Patent
Sinha et al.

(10) Patent No.: US 7,678,674 B1
(45) Date of Patent: Mar. 16, 2010

(54) MEMORY CELL DUAL POCKET IMPLANT

(75) Inventors: Shankar Sinha, Redwood Shores, CA (US); Ashot Melik-Martirosian, Sunnyvale, CA (US); Ihsan Djomehri, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/211,509

(22) Filed: Aug. 26, 2005

(51) Int. Cl.
*H01L 21/425* (2006.01)

(52) U.S. Cl. .................. 438/529; 438/201; 438/211; 438/514; 438/517; 438/527; 257/E21.147

(58) Field of Classification Search .................. 438/517, 438/514, 201, 211, 302–306, 518, 529; 257/E21.147
See application file for complete search history.

(56) References Cited

U.S. PATENT DOCUMENTS

| | | | | |
|---|---|---|---|---|
| 6,030,869 A * | 2/2000 | Odake et al. | | 438/266 |
| 6,215,148 B1 * | 4/2001 | Eitan | | 257/316 |
| 6,329,235 B1 * | 12/2001 | Kuo | | 438/238 |
| 6,348,711 B1 | 2/2002 | Eitan | | 257/316 |
| 6,391,730 B1 * | 5/2002 | Kluth et al. | | 438/302 |
| 6,429,063 B1 * | 8/2002 | Eitan | | 438/232 |
| 6,465,315 B1 * | 10/2002 | Yu | | 438/306 |
| 6,589,847 B1 * | 7/2003 | Kadosh et al. | | 438/302 |
| 6,664,588 B2 | 12/2003 | Eitan | | 257/316 |
| 6,756,276 B1 * | 6/2004 | Xiang et al. | | 438/289 |
| 7,170,084 B1 * | 1/2007 | Xiang et al. | | 257/19 |
| 2002/0000606 A1 * | 1/2002 | Eitan | | 257/316 |
| 2002/0020890 A1 * | 2/2002 | Willer | | 257/390 |
| 2002/0072176 A1 * | 6/2002 | Park et al. | | 438/286 |
| 2004/0110351 A1 * | 6/2004 | Narasimha | | 438/302 |
| 2005/0148114 A1 * | 7/2005 | Rhodes | | 438/120 |
| 2006/0105489 A1 * | 5/2006 | Rhodes | | 438/48 |

OTHER PUBLICATIONS

Wolf, Silicon processing for the VLSI era, vol. 2, 1990, pp. 341-345.*
Wolf, Silicon processing for the VLSI era, vol. 4, 2002, pp. 4-8.*
Wolf, Silicon processing for the VLSI era, vol. 4, 2002, pp. 219-222.*
Saha, Scaling considerations for high performance 25 nm metal-oxide-semiconductor field effect transistors, 2001, pp. 2240-2246.*

* cited by examiner

*Primary Examiner*—Wael Fahmy
*Assistant Examiner*—Minchul Yang
(74) *Attorney, Agent, or Firm*—Harrity & Harrity, LLP

(57) ABSTRACT

A method of forming implants for a memory cell includes forming an oxide-nitride-oxide (ONO) stack over a substrate and implanting first impurities in the substrate adjacent each side of the ONO stack using a first implantation energy and a first tilt angle to produce first pocket implants. The method further includes implanting second impurities in the substrate adjacent each side of the ONO stack using a second implantation energy and a second tilt angle to produce second pocket implants, where the second implantation energy is substantially larger than the first implantation energy and where the second tilt angle is substantially larger than the first tilt angle.

11 Claims, 16 Drawing Sheets

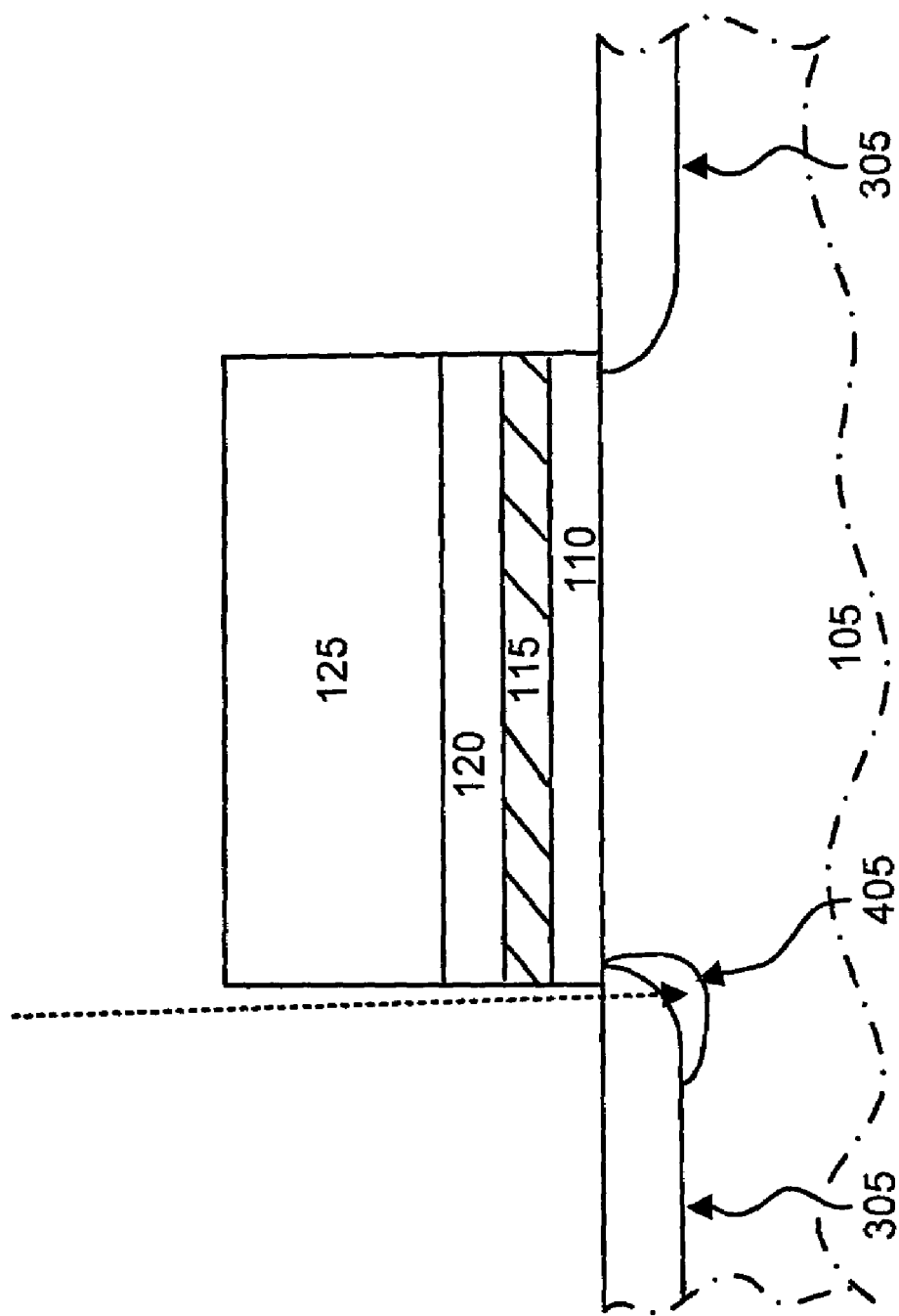

MEMORY CELL DUAL POCKET IMPLANT

TECHNICAL FIELD

The present invention relates generally to semiconductor devices and, more particularly, to the use of implants in memory cell semiconductor devices.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. In Flash EEPROM devices, a group or block of memory cells may be programmed and/or erase together.

Product development efforts in EEPROM device technology have focused on increasing the programming speed, lowering programming and reading voltages, increasing data retention time, reducing cell erasure times and reducing cell dimensions. One conventional structure used for fabricating an EEPROM device is an oxide-nitride-oxide (ONO) structure. One EEPROM device that utilizes the ONO structure is a silicon-oxide-nitride-oxide-silicon (SONOS) type device. In a SONOS type device, an ONO stack is formed on a silicon substrate. A silicon control gate is then formed over the ONO stack.

In SONOS devices, during programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon oxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

DISCLOSURE OF THE INVENTION

According to an aspect of the invention, a method of forming implants for a memory cell includes forming an oxide-nitride-oxide (ONO) stack over a substrate and implanting first impurities in the substrate adjacent each side of the ONO stack using a first implantation energy and a first tilt angle to produce first pocket implants. The method further includes implanting second impurities in the substrate adjacent each side of the ONO stack using a second implantation energy and a second tilt angle to produce second pocket implants, where the second implantation energy is substantially larger than the first implantation energy and where the second tilt angle is substantially larger than the first tilt angle.

According to another aspect of the invention, a method of forming a memory cell includes forming a column over a substrate, the column including a first oxide layer, a charge storage layer and a second oxide layer. The method further includes forming a bit line in the substrate adjacent a side of the column and implanting a first pocket of impurities through the bit line adjacent the side of the column using a low implantation energy and a small tilt angle. The method also includes implanting a second pocket of impurities through the bit line adjacent the side of the column using a high implantation energy and a large tilt angle.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 4A & 4B illustrate the implantation of a left side pocket implant at a low tilt angle and a low implantation energy consistent with an aspect of the invention;

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Consistent with aspects of the invention, dual pocket implants may be implanted in bit lines disposed on each side of a memory cell. First pockets may be implanted in the bit lines at a low implantation energy at a small tilt angle. Second pockets may be implanted in the bit lines at high implantation energy at a high tilt angle. Use of the dual pocket implants permits independent control of threshold voltage ($V_T$) and program/erase speed for the memory cell.

Figure 1:
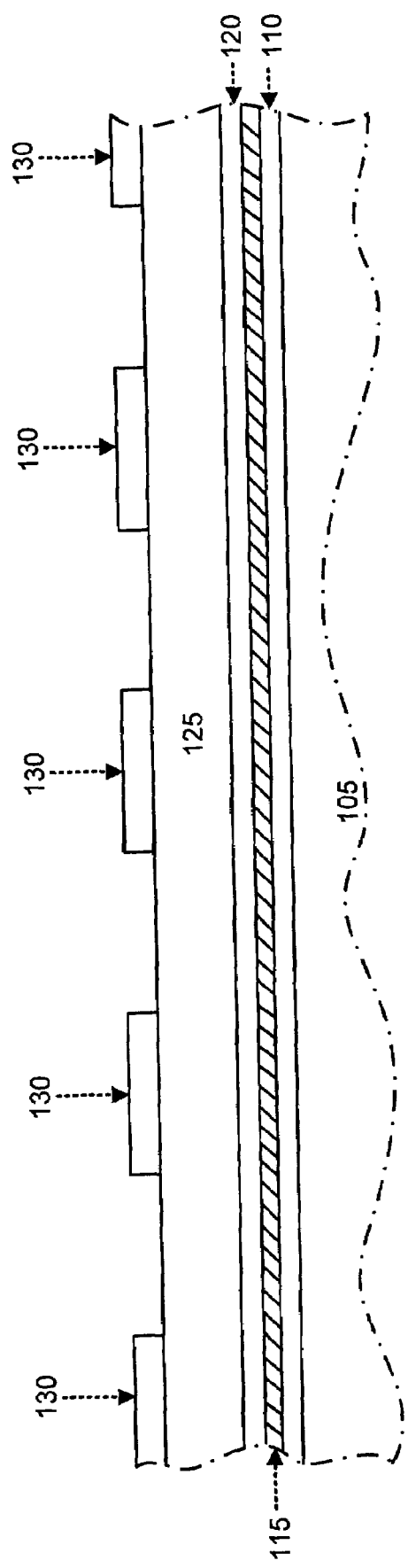
FIG. 1 illustrates the formation of a mask layer and photo-resist pattern over an oxide-nitride-oxide (ONO) stack consistent with an aspect of the invention.

FIG. 1 illustrates a cross-section of a semiconductor substrate 105 according to an exemplary embodiment of the invention. Substrate 105, consistent with one aspect, may include a crystal silicon wafer. In other implementations, substrate 105 may include a gallium arsenide layer, a silicon-on-insulator structure, a germanium layer, a silicon-germanium layer, or other conventional materials used to form a semiconductor substrate. A bottom oxide layer 110 may be formed on substrate 105. Bottom oxide layer 110 may be formed on substrate 105 using, for example, an existing thermal oxidation process. Bottom oxide layer 110 may include oxide materials, such as, for example, silicon oxide (e.g., $SiO_2$), or silicon oxynitride. The thickness of bottom oxide layer 110 may range, for example, from about 30 Å to about 100 Å.

A charge storage layer 115 may be formed on bottom oxide layer 110 using, for example, existing deposition processes, such as conventional CVD processes. In one exemplary embodiment, charge storage layer 115 may include a nitride charge storage layer, such as, for example, a silicon nitride (e.g., $Si_3N_4$). In other embodiments, charge storage layer 115 may include other known dielectric materials that may be used to store a charge. The thickness of charge storage layer 115 may range, for example, from about 40 Å to about 100 Å. In still other alternatives, charge storage layer 115 may include a conductive material, such as polycrystalline silicon, used to form a floating gate electrode.

A top oxide layer 120 may be formed on charge storage layer 115. Top oxide layer 120 may be formed on charge storage layer 115 using, for example, an existing thermal oxidation process. Top oxide layer 120 may include oxide materials, such as, for example, a silicon oxide, or a silicon oxynitride. The thickness of top oxide layer 120 may range, for example, from about 30 Å to about 100 Å.

A mask layer 125 may be formed on top oxide layer 120. Mask layer 125 may be formed using, for example, existing deposition processes, such as a CVD process. Mask layer 125 may include, for example, a polycrystalline silicon material, though other materials may be used. The thickness of mask layer 125 may range, for example, from about 300 Å to about 1000 Å. A photo-resist layer 130 may then be formed over mask layer 125 in a desired column pattern using existing photolithographic processes.

Figure 2:
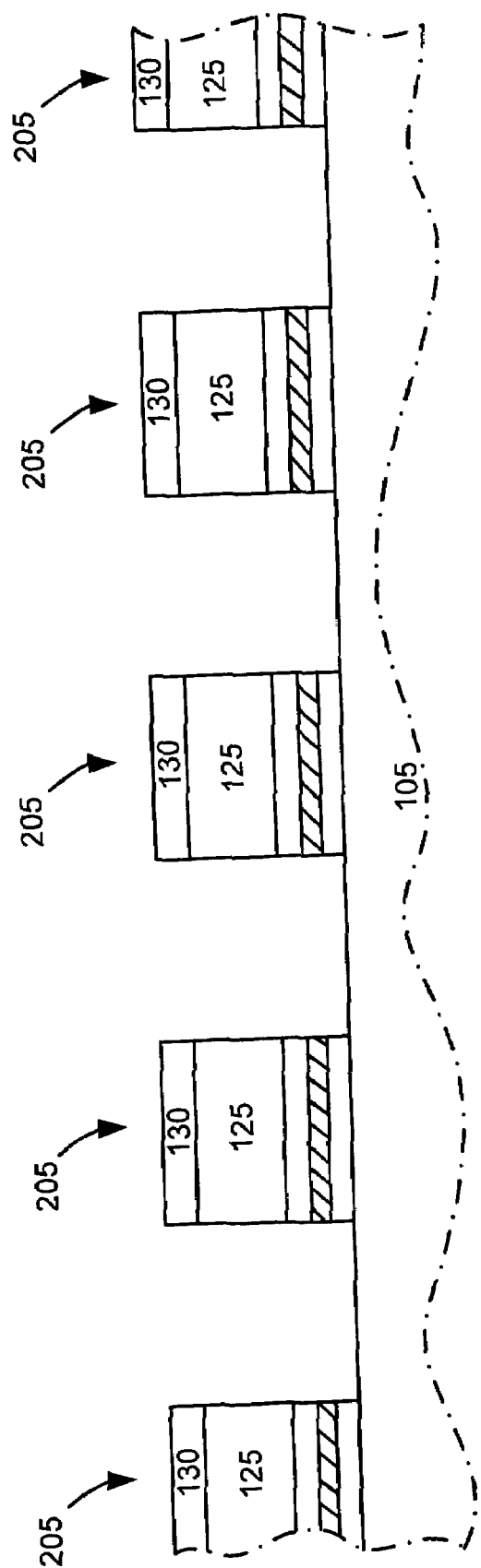
FIG. 2 illustrates etching of the layers of FIG. 1 to produce memory cell columns consistent with an aspect of the invention.
Figure 3:
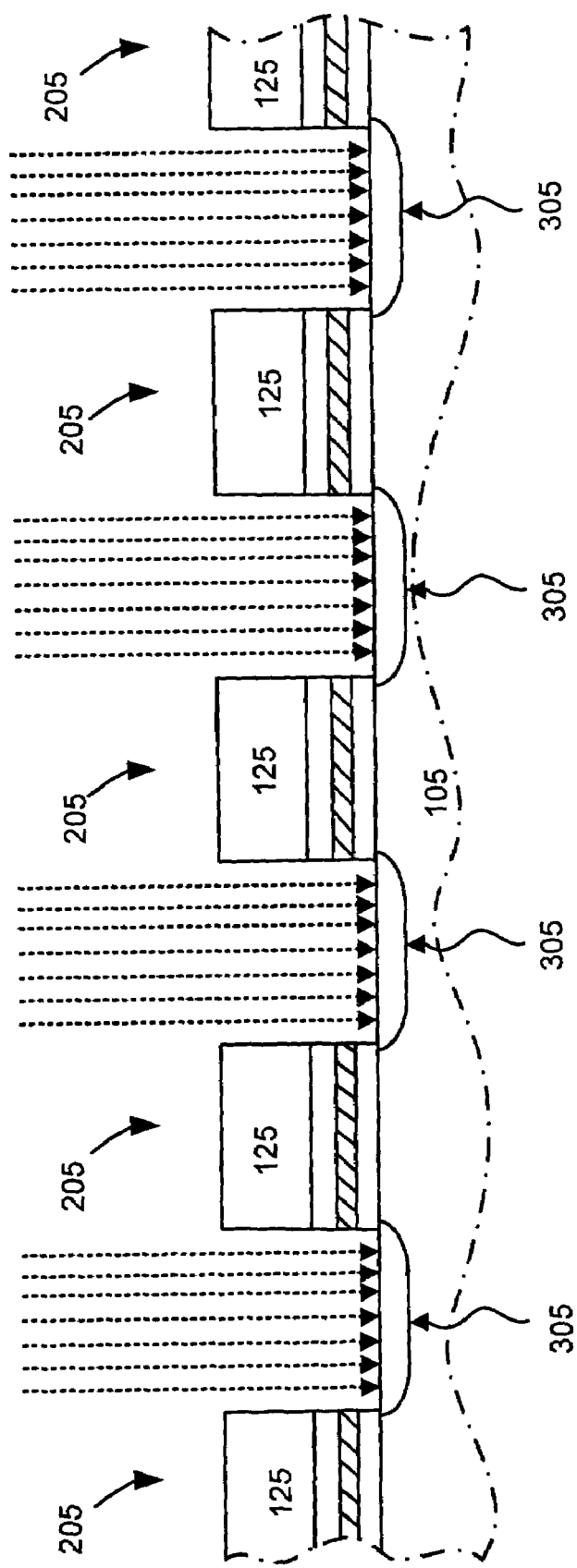
FIG. 3 illustrates the implantation of bit lines between the memory cell columns of FIG. 2 consistent with an aspect of the invention.
Figure 4A:
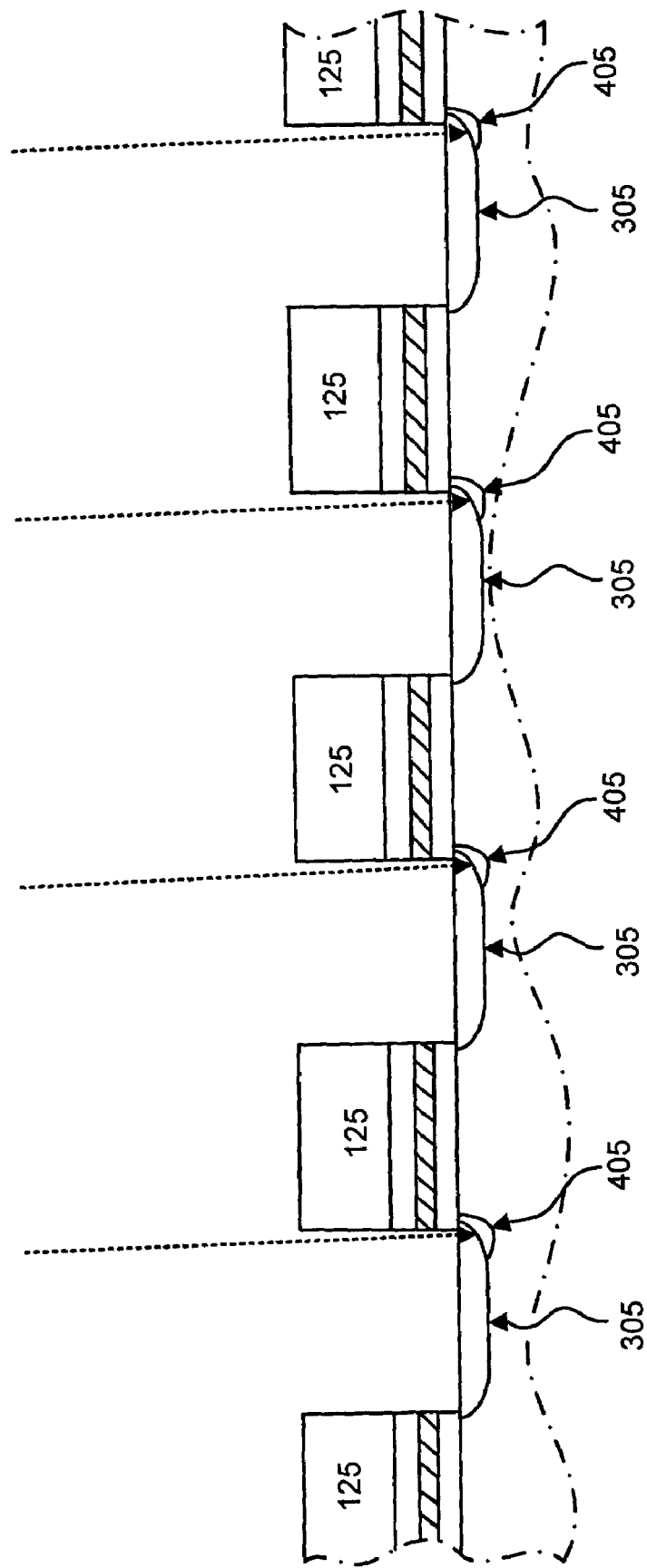
Figure 5A:
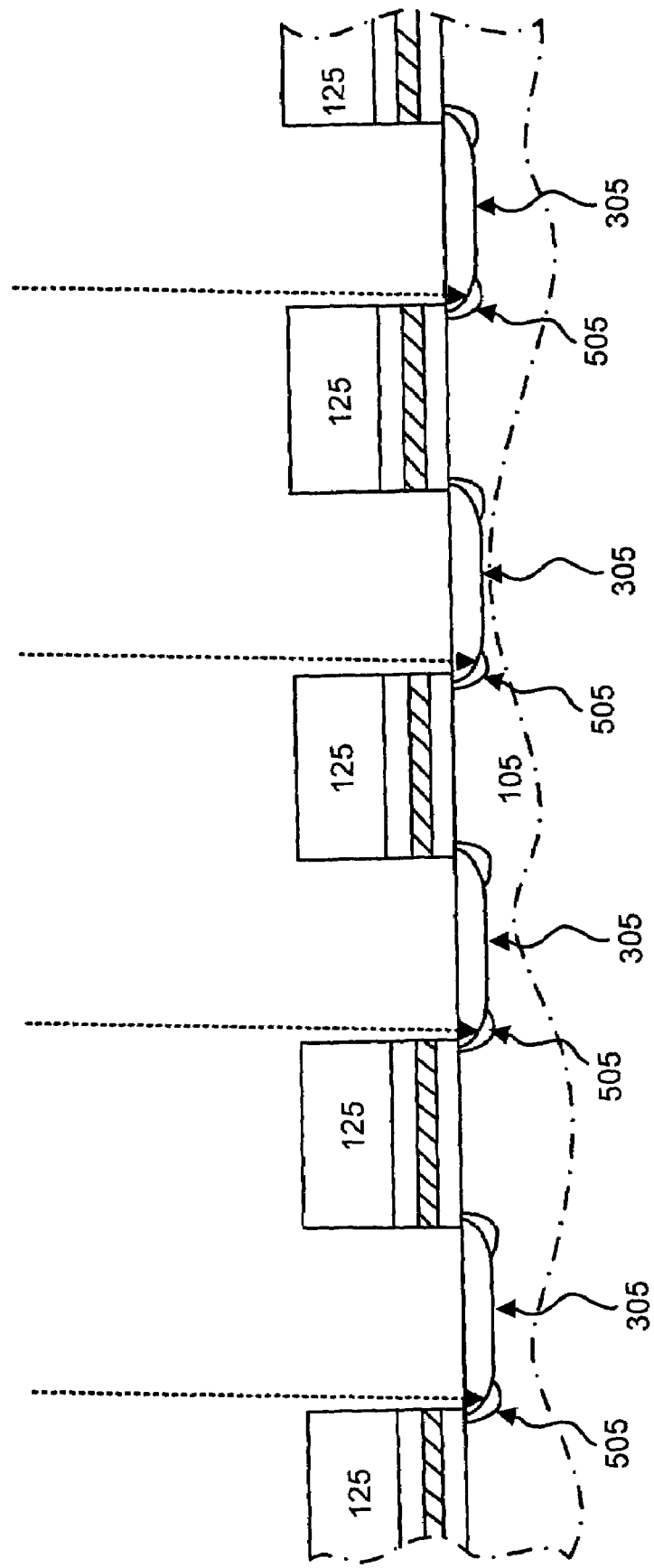
FIGS. 5A & 5B illustrate the implantation of a right side pocket implant at a low tilt angle and a low implantation energy consistent with an aspect of the invention.
Figure 5B:
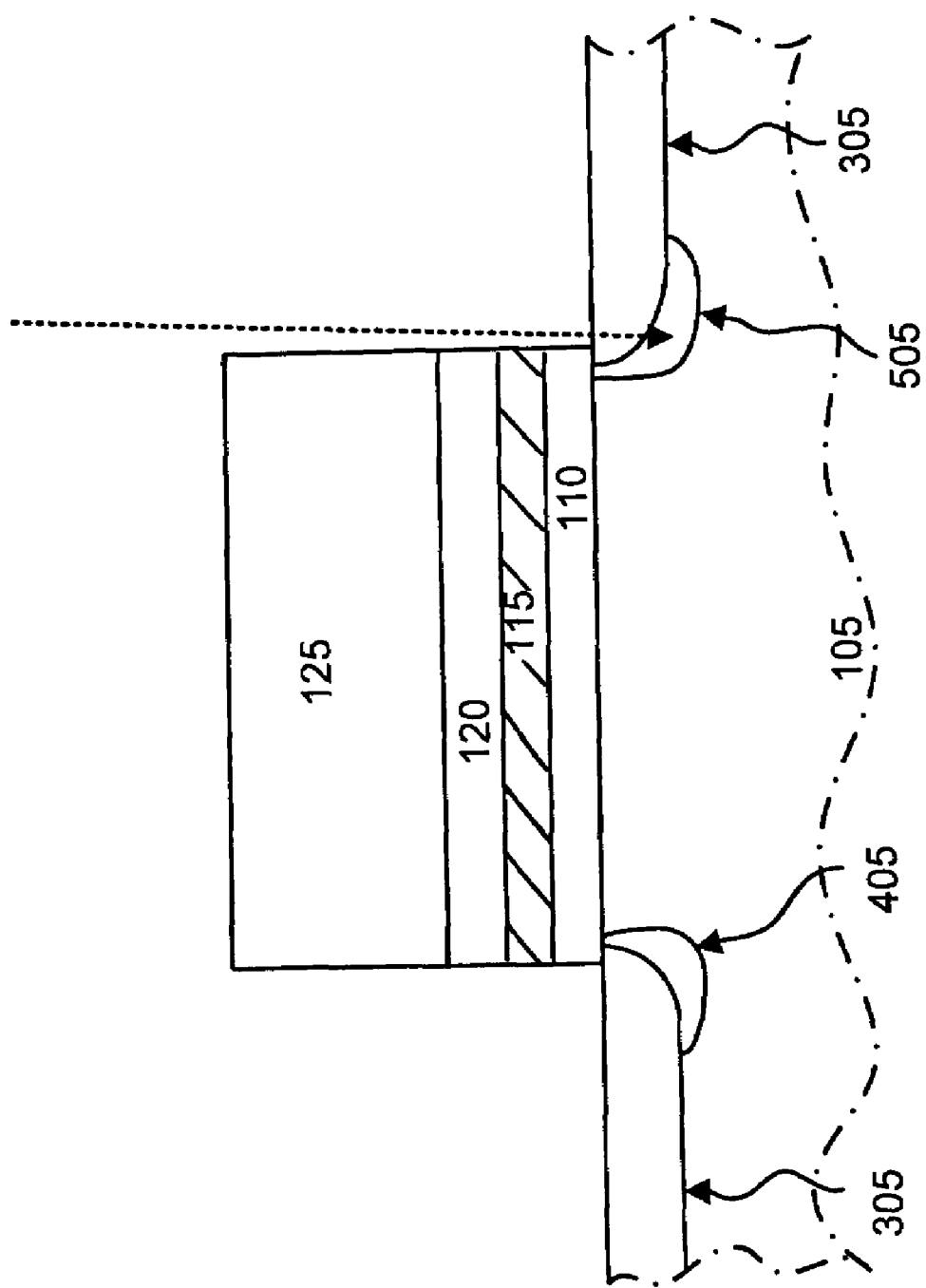
Figure 6A:
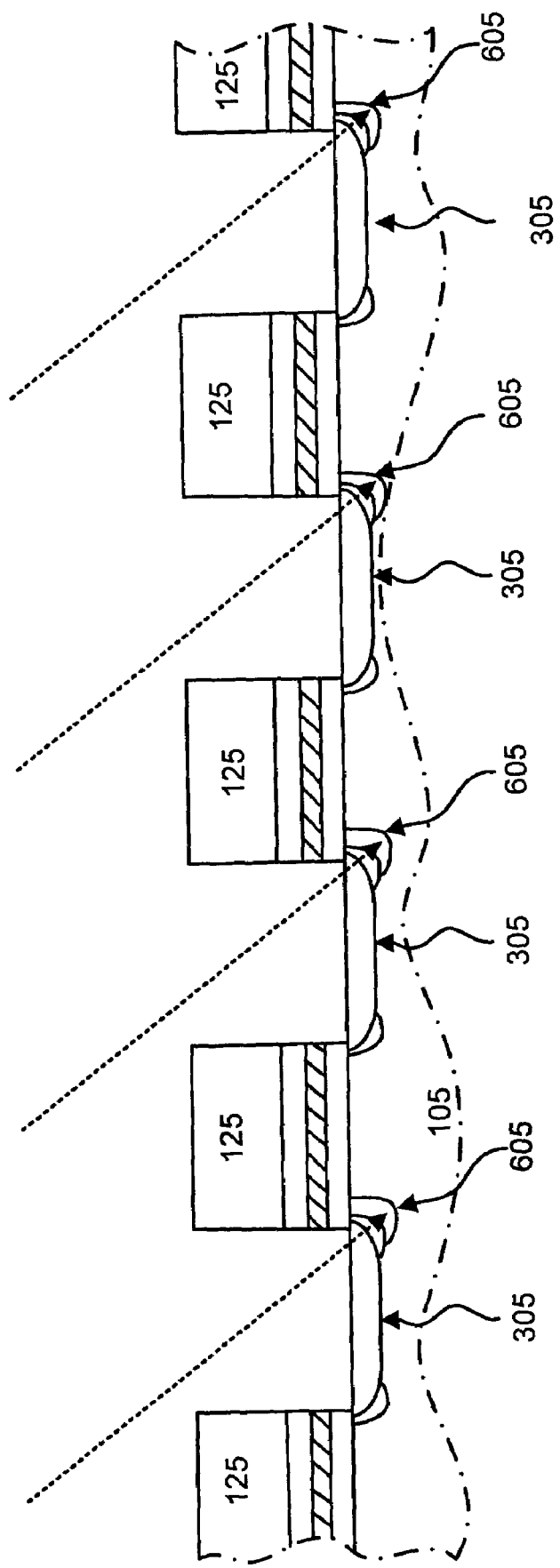
FIGS. 6A & 6B illustrate the implantation of a left side pocket implant at a high tilt angle and a high implantation energy consistent with an aspect of the invention.
Figure 6B:
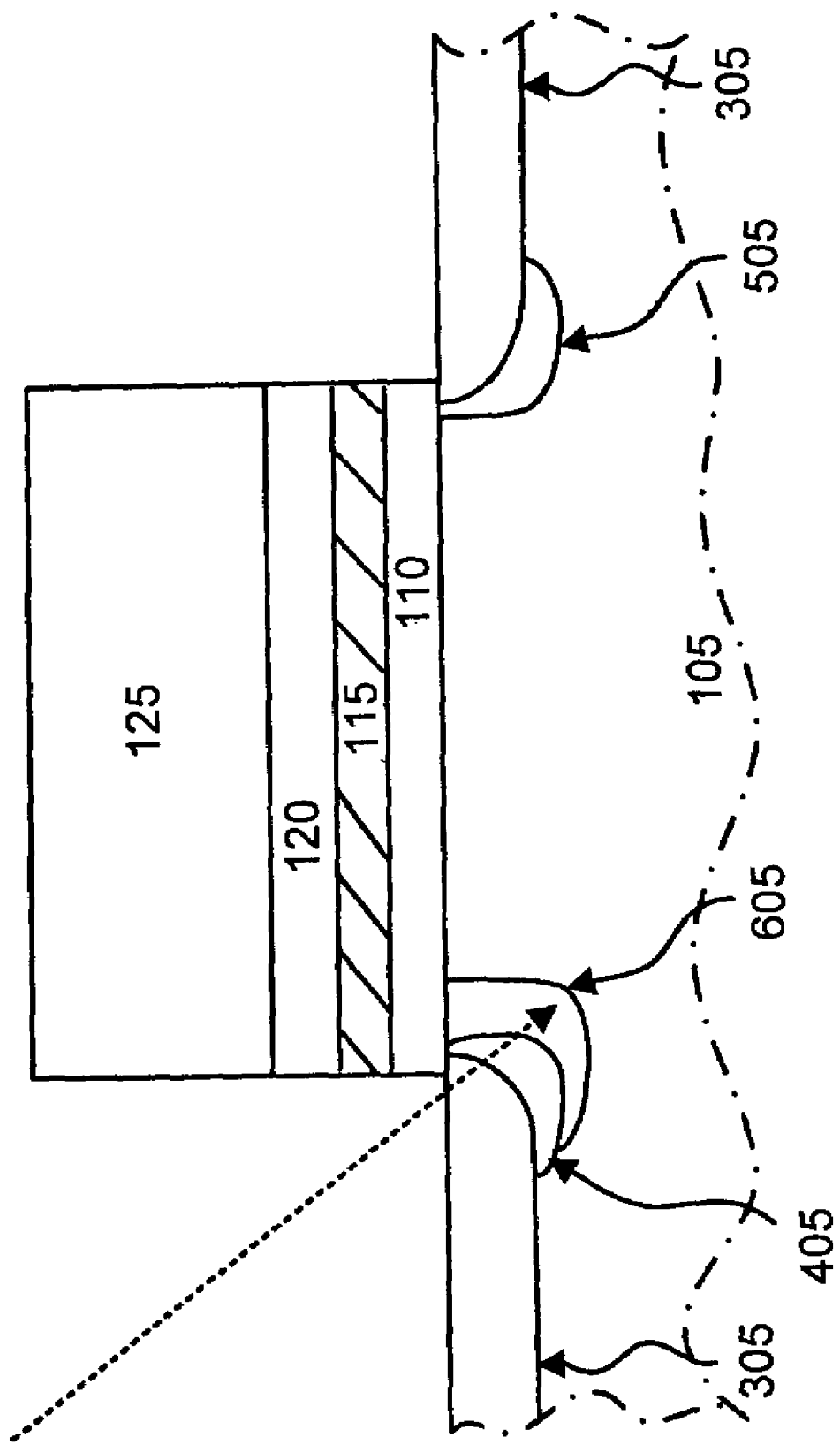
Figure 7A:
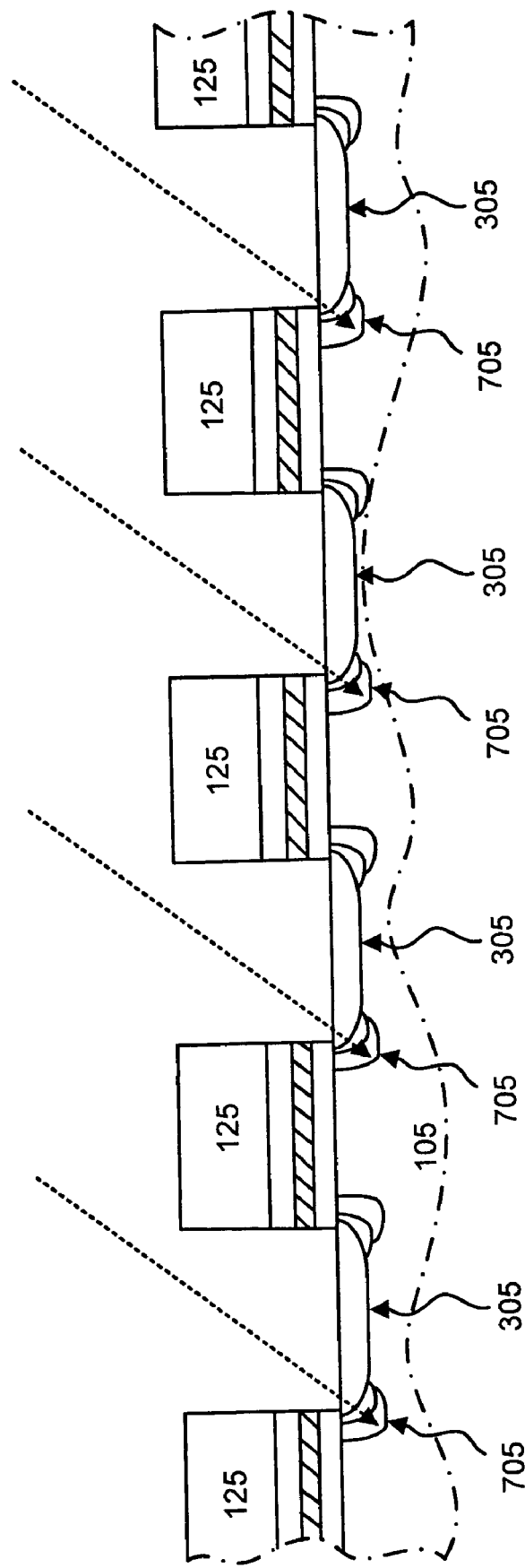
FIGS. 7A & 7B illustrate the implantation of a right side pocket implant at a high tilt angle and a high implantation energy consistent with an aspect of the invention.
Figure 7B:
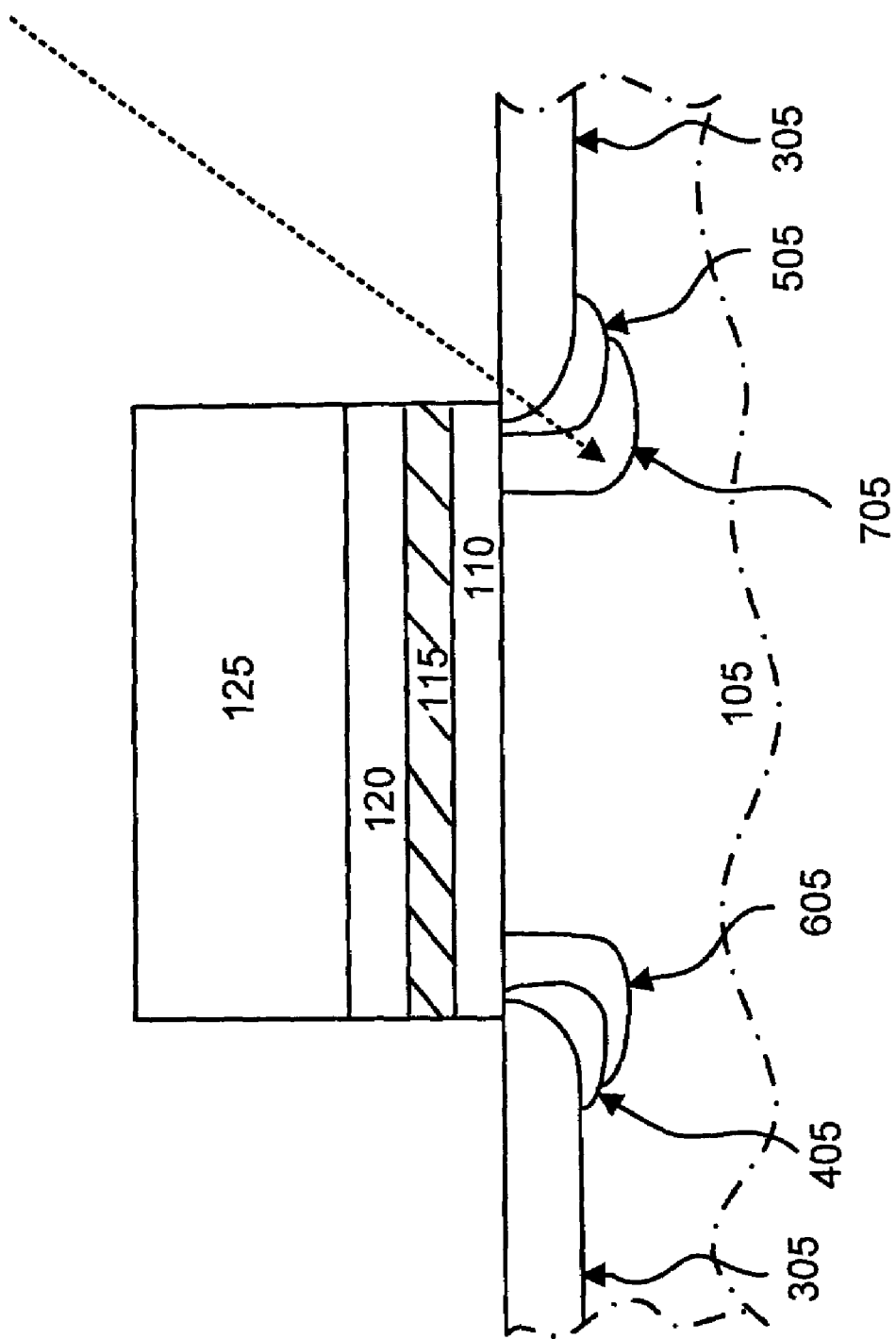

As shown in FIG. 2, mask layer 125, top oxide layer 120, charge storage layer 115 and bottom oxide layer 110 may be etched using, for example, an existing etching process, such as a dry etch process, to create columns 205 that include a portion of layers 110, 115, 120 and 125. Bit lines 305 may then be formed between each column 205, as shown in FIG. 3. The bit lines 305 may correspond to source and/or drain regions for memory cells in each column 205. To form each bit line 305, impurities, such as, for example, arsenic or phosphorus, may be implanted between columns 205 in substrate 105. The impurities may be implanted at a dosage of about 5E14 atoms/cm² to about 5E15 atoms/cm² and an implantation energy of about 3 KeV to about 15 KeV. The impurities may be implanted at a tilt angle of approximately 0 degrees as indicated by the arrows in FIG. 3. In an exemplary embodiment, bit lines 305 may be formed to a depth ranging from about 200 Å to about 600 Å below the upper surface of substrate 105.

First pockets that include a right pocket 405 and a left pocket 505 may then be formed in each bit line 305, as shown in FIGS. 4A, 4B, 5A and 5B, using mask layer 125 as a bit line mask. To form each pocket 405 and 505, impurities, such as, for example, boron, $BF_2$, or indium, may be implanted in each bit line 305. The impurities may be implanted at a dosage of about 5E13 atoms/cm² to about 1E15 atoms/cm² at a low implantation energy, such as, for example, an implantation energy of about 2 KeV to about 5 KeV. The impurities may be implanted at a small tilt angle of approximately 0 degrees to approximately 5 degrees in a right and left side of each bit line 305, as indicated by the arrows in FIGS. 4A and 5A. Pockets 405 and 505 may produce shallow p+ junctions that can control the speed of the memory cell program/erase. In an exemplary embodiment, pockets 405 and 505 may be formed to a depth ranging from about 200 Å to about 500 Å below the upper surface of substrate 105.

Second pockets that include a right pocket 605 and a left pocket 705 may then be formed in each bit line 305, as shown in FIGS. 6A, 6B, 7A and 7B, using mask layer 125 as a bit line mask. To form each pocket 605 and 705, impurities, such as, for example, boron, $BF_2$, or indium, may be implanted in each bit line 305. The impurities may be implanted at a dosage of about 1E13 atoms/cm² to about 1E14 atoms/cm² at a high implantation energy, such as, for example, an implantation energy of about 7 KeV to about 20 KeV. The impurities may be implanted at a large tilt angle of approximately 35 degrees to approximately 55 degrees in a right and left side of each bit line 305, as illustrate by the arrows in FIGS. 6A and 7A. In an exemplary embodiment, pockets 605 and 705 may be formed to a depth ranging from about 700 Å to about 1200 Å below the upper surface of substrate 105. As illustrated, pockets 605 and 705 may extend below pockets 405 and 505 and may extend further into the channel region below each column of memory cells. Pockets 605 and 705 may permit control of $V_T$ for the memory cell.

Implantation of pockets 405, 505, 605 and 705 in respective bit lines 305 for a memory cell allow for independent control of $V_T$ targeting and program/erase speed control. Generally, a higher implantation dose has better program/erase speed, but also higher $V_T$. Higher $V_T$ can be detrimental to some aspects of device operation (e.g., less sense margin, worse data retention, etc.). Hence, one goal of the present invention is to reduce implantation dosage to lower $V_T$. Consistent with principles of the invention, implantation dosage of second pockets 605 and 705 may be relatively low to keep a lower $V_T$ and implantation dosage of first pockets 405 and 505 may be higher to control program/erase speeds (and maybe short channel effects). Also, a deeper implantation pocket (i.e., using higher energy) requires a lower implantation dosage to maintain about the same $V_T$.

In some implementations, the order of implantation of pockets 405 and 505 and 605 and 705, as described above, may be reversed. In addition, one or more thermal steps to activate the implants may be performed between each implantation. Alternatively, one thermal step may be performed after all the implantations to activate the implants. For example, an anneal cycle, such as a rapid thermal anneal (RTA) process at a temperature ranging from about 900° C. to about 1050° C. for a period ranging from about 1 to about 10 seconds, may be used.

Figure 8:
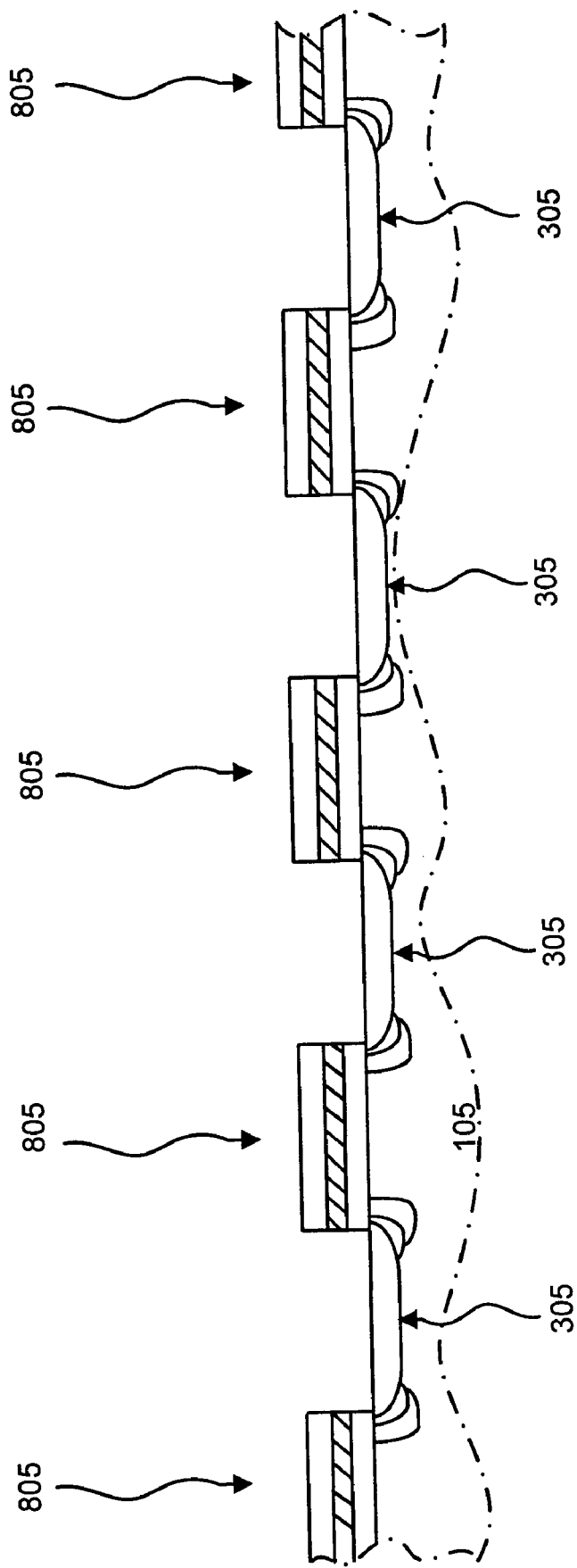
FIG. 8 illustrates removal of the mask layer from the ONO stacks of FIG. 7A consistent with an aspect of the invention.
Figure 9:
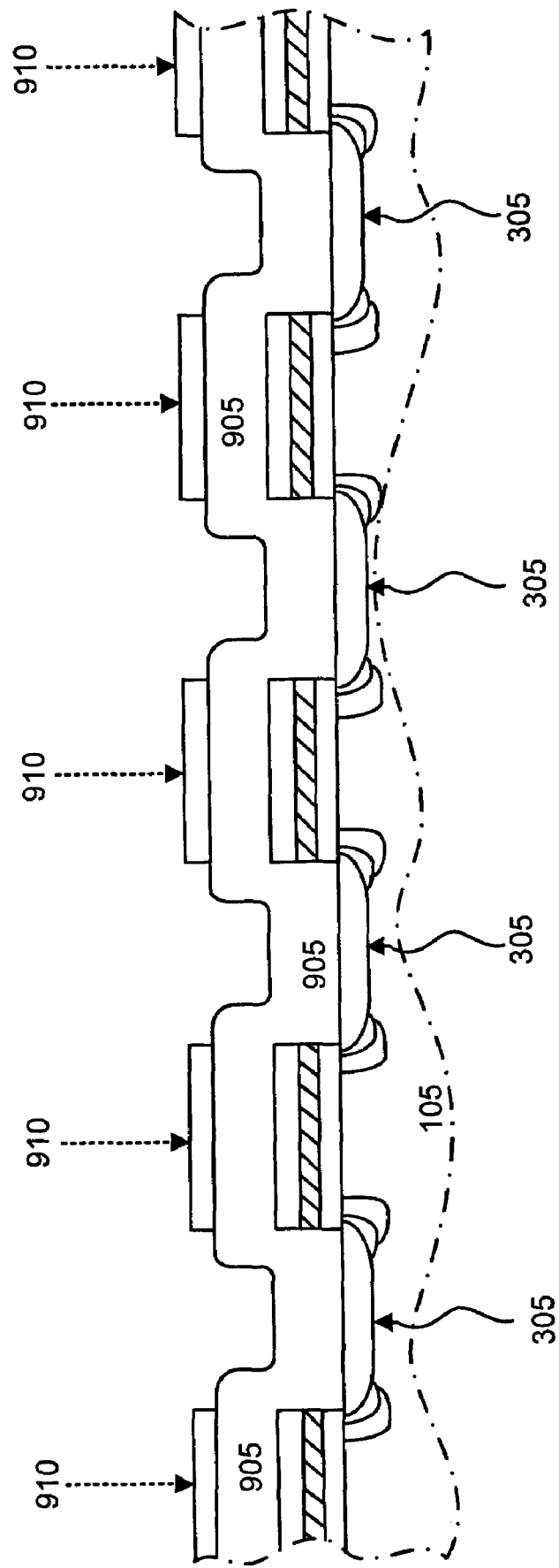
FIG. 9 illustrates the formation of a gate electrode layer and a photo-resist pattern over the ONO stacks of FIG. 8 consistent with an aspect of the invention.
Figure 10:
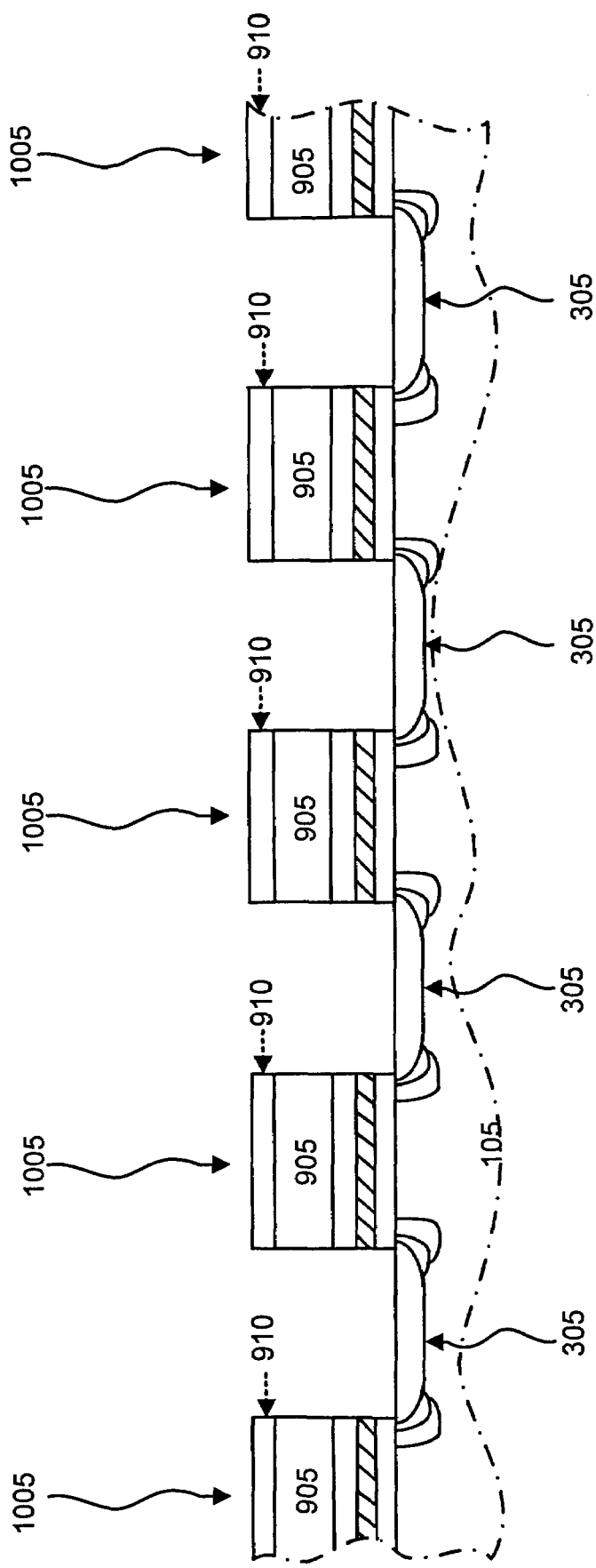
FIG. 10 illustrates etching of the gate electrode layer of FIG. 9 to produce memory cells having gates over the ONO stacks consistent with an aspect of the invention.

As shown in FIG. 8, subsequent to implantation of pocket implants 405, 505, 605 and 705, mask layer 125 may be removed to produce columns 805 that each include layers 110, 115 and 120. Mask layer 125 may be removed using existing stripping processes. As shown in FIG. 9, a gate electrode layer 905 may then be formed over columns 805 using, for example, existing deposition processes. Gate electrode layer 905 may include, for example, polycrystalline silicon, or a metal such as TaN or TiN. The thickness of gate electrode layer 905 may range, for example, from about 500 Å to about 1000 Å. A photo-resist layer 910 may be formed over gate electrode layer 905 in a desired column pattern using existing photolithographic processes. As further shown in FIG. 10, gate electrode layer 905 may be etched using, for example, an existing etching process, such as a dry etch process, to create cells 1005 that each include a portion of gate electrode layer 905.

Figure 11A:
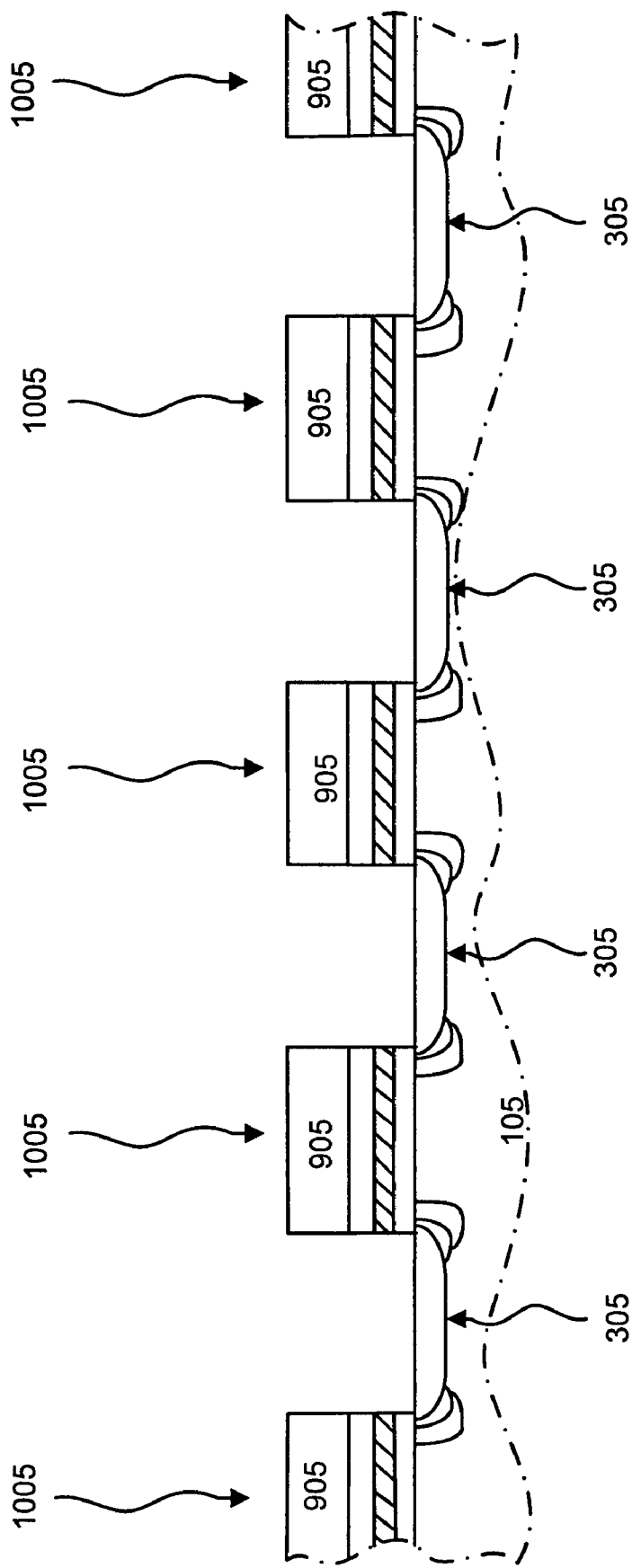
FIGS. 11A & 11B illustrate the removal of the photo-resist pattern of FIG. 10 consistent with an aspect of the invention.
Figure 11B:
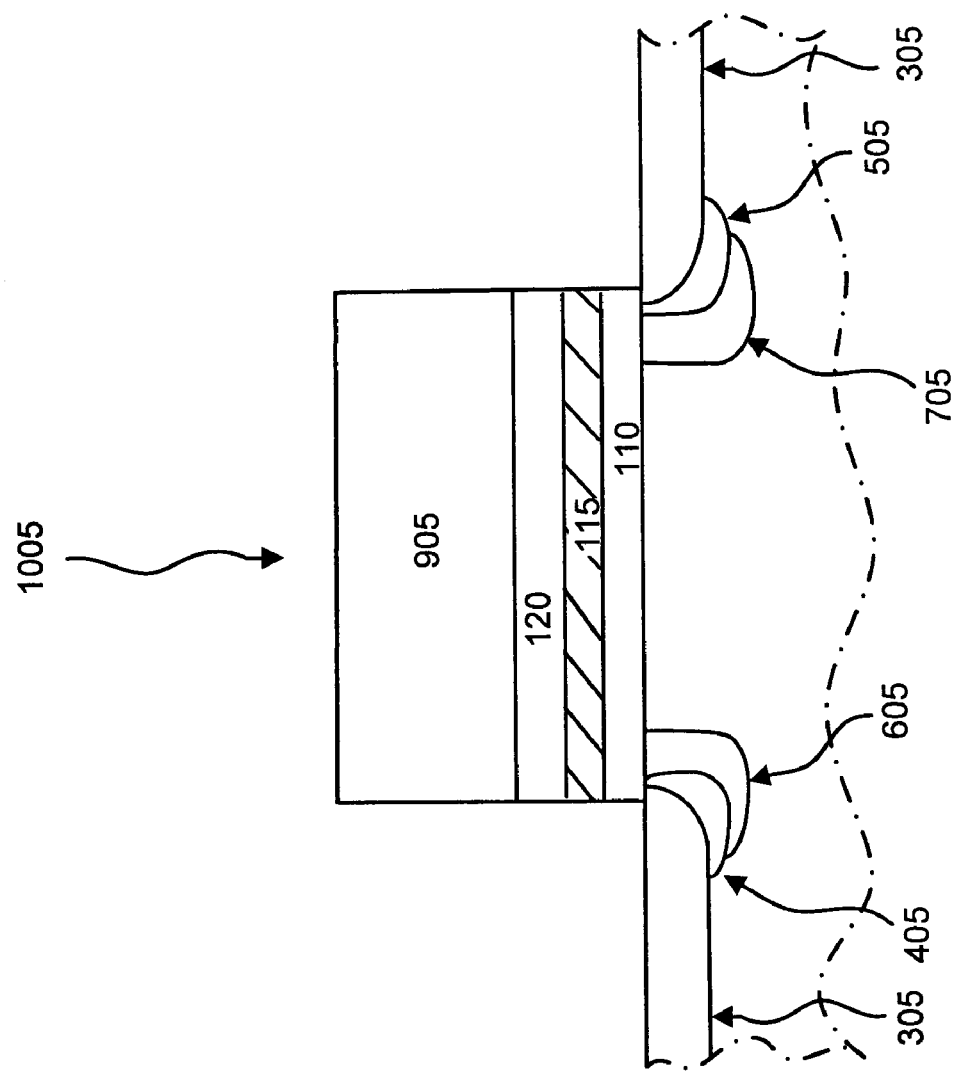

As shown in FIGS. 11A and 11B, photo-resist layer 910 may be removed from each cell 1005 using, for example, existing stripping processes. After removal of photo-resist layer 910, each cell may include a gate electrode 905, a top oxide layer 120, a charge storage layer 115, a bottom oxide layer 110. As shown, a bit line 305 may reside in substrate 105 on each side of each cell 1005, with pocket implants 405, 505, 605 and 705 formed beneath each side of each cell 1005 adjacent a respective bit line 305.

In an exemplary implementation, during operation of each cell 1005, voltages may be applied to gate electrode 905, and bit lines 305 on either side of gate electrode 905. The applied voltages may cause electrical charge from bit lines 305 on either side of cell 1005 to propagate across a channel region (i.e., a region of substrate 105 between the bit lines on either side of cell 1005) and to tunnel from the channel region through the bottom oxide layer 110 for retention in charge storage layer 115. The layered stack structure that includes bottom oxide layer 110, charge storage layer 115, and top oxide layer 120 permits channel erase in cell 1005, where charge in gate electrode 905 may be discharged via a channel region.

In an exemplary implementation consistent with the invention, each memory cell 1005, as illustrated in FIG. 11A, may be configured to store two bits of data. That is, charge storage layer 115 may be programmed to store two separate bits of data by localizing the first and second charges to the respective left and right sides of charge storage layer 115. For example, each of the two bits of each memory cell 1005 may be programmed independently by, for example, channel hot electron injection, to store charge representing a bit on each respective side of the charge storage layer 115. In this manner, the charges in charge storage layer 115 become effectively trapped on each respective side of charge storage layer 115. During erasing, the charges stored in charge storage layer 115 may tunnel through bottom oxide layer 110 into the source region and drain region, respectively. In this manner, the density of an array of multiple memory cells 1005 may be increased as compared to conventional memory devices that store only one bit of data per cell. In alternative implementations, each memory cell 1005 may be configured to store one bit of data per memory cell 1005.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts have been described above, the order of the acts may vary in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A method of forming implants for a memory cell, comprising:
   forming an oxide-nitride-oxide (ONO) stack over a substrate;
   implanting first p-type impurities in the substrate adjacent each side of the ONO stack at a dosage of about 5E13 atoms/cm$^2$ to about 1E15 atoms/cm$^2$, at an implantation energy of about 2 KeV to about 5 KeV, and at a tilt angle of approximately 0 degrees to approximately 5 degrees relative to an upper surface of the substrate, wherein the first p-type impurities control program and erase speed for the memory cell; and
   implanting second p-type impurities in the substrate adjacent each side of the ONO stack at a dosage of about 1E13 atoms/cm$^2$ to about 1E14 atoms/cm$^2$, at an implantation energy of about 7 KeV to about 20 KeV, and at a tilt angle of approximately 35 degrees to approximately 55 degrees relative to an upper surface of the substrate, wherein the second p-type impurities control a threshold voltage ($V_T$) for the memory cell.

2. The method of claim 1, wherein the first p-type impurities comprise one of boron, BF$_2$, or indium.

3. The method of claim 1, wherein the second p-type impurities comprise one of boron, BF$_2$, or indium.

4. A method of forming a memory cell, comprising:
   forming a column over a substrate, the column comprising a first oxide layer, a charge storage layer and a second oxide layer;
   forming a bit line in the substrate adjacent a side of the column;
   implanting a first pocket of p-type impurities through the bit line adjacent the side of the column using a low implantation energy and a small tilt angle, wherein implanting the first pocket of impurities comprises implanting the first pocket of impurities at a dosage of about 1E14 atoms/cm$^2$ to about 1E15 atoms/cm$^2$ and at an implantation energy of about 2 KeV to about 5 KeV; and
   implanting a second pocket of p-type impurities through the bit line adjacent the side of the column using a high implantation energy and a large tilt angle, wherein implanting the second pocket of impurities comprises implanting the second pocket of impurities at a dosage of about 1E13 atoms/cm$^2$ to about 1E14 atoms/cm$^2$ and at an implantation energy of about 7 KeV to about 20 KeV, wherein implanting the first pocket of p-type impurities and implanting the second pocket of p-type impurities permits independent control of a voltage threshold ($V_T$) and program and erase speed for the memory cell.

5. The method of claim 4, wherein implanting the first p-type pocket of impurities comprises:

implanting the first pocket of impurities at a tilt angle of approximately 0 degrees to approximately 5 degrees.

6. The method of claim 4 wherein the first pocket of p-type impurities comprises one of boron, $BF_2$, or indium.

7. The method of claim 4, wherein implanting the second pocket of p-type impurities comprises:

implanting the second pocket of p-type impurities at a tilt angle of approximately 35 degrees to approximately 55 degrees.

8. The method of claim 4, wherein the second pocket of p-type impurities comprises one of boron, $BF_2$, or indium.

9. The method of claim 4, wherein forming the bit line comprises:

implanting impurities at a dosage of about 5E14 atoms/cm$^2$ to about 5E15 atoms/cm$^2$ and at an implantation energy of about 3 KeV to about 15 KeV.

10. The method of claim 9, wherein forming the bit line comprises:

implanting the impurities at a tilt angle of approximately 0 degrees.

11. The method of claim 10, wherein the impurities comprise one of arsenic or phosphorous.

* * * * *